United States Patent [19]
MacDonald, Jr. et al.

[11] Patent Number: 5,905,638
[45] Date of Patent: May 18, 1999

[54] METHOD AND APPARATUS FOR PACKAGING A MICROELECTRONIC DEVICE WITH AN ELASTOMER GEL

[75] Inventors: James D. MacDonald, Jr.; Walter M. Marcinkiewicz, both of Apex; Rahul Gupta, Cary, all of N.C.

[73] Assignee: Ericsson Inc., Research Triangle Park, N.C.

[21] Appl. No.: 08/993,815

[22] Filed: Dec. 18, 1997

[51] Int. Cl.⁶ ............................... H05K 7/10; H05K 7/12

[52] U.S. Cl. .................... 361/769; 174/117 A; 174/52.4; 361/767; 361/771; 361/820; 439/66

[58] Field of Search ............................... 174/117 A, 259, 174/260, 261, 52.4; 206/706, 714, 716, 722, 724, 728; 257/678, 688, 700, 723, 726, 727, 746, 778, 783, 785; 324/755, 758, 765, 158.1; 361/760, 767, 768–771, 774, 776, 779, 783, 807, 809, 820; 438/117–119; 439/330, 331, 333, 66, 68, 70, 71, 72, 74, 81, 82, 84, 86, 91, 178, 179, 591, 366

[56] References Cited

U.S. PATENT DOCUMENTS

| | | | |
|---|---|---|---|
| 4,008,300 | 2/1977 | Ponn | 439/91 |
| 4,770,641 | 9/1988 | Rowlette | 439/86 |
| 5,074,799 | 12/1991 | Rowlette, Sr. | 439/178 |
| 5,424,652 | 6/1995 | Hembree et al. | 324/765 |

*Primary Examiner*—Donald Sparks
*Attorney, Agent, or Firm*—Wood, Phillips, VanSanten, Clark & Mortimer

[57] ABSTRACT

An apparatus and method for packaging a microelectronic device to be connectable to a distribution circuit. The apparatus is in the form of a microelectronic package including a microelectronic device having first and second oppositely facing surfaces and a plurality of Input/Output pads on the first surface capable of being electrically interconnected to a distribution circuit, a base adapted to support the microelectronic device in a predetermined operative relationship to a distribution circuit, and a first layer of elastomer gel sandwiched between the first surface and the base. The first surface of the microelectronic device overlays the base so as to allow an electrical interconnection through the base between the microelectronic device and a distribution circuit.

25 Claims, 2 Drawing Sheets

METHOD AND APPARATUS FOR PACKAGING A MICROELECTRONIC DEVICE WITH AN ELASTOMER GEL

FIELD OF THE INVENTION

This invention relates to electronic devices and, more particularly, to microelectronic devices that are capable of being connected to a distribution circuit.

BACKGROUND OF THE INVENTION

It is often desirable to test or "burn-in" the microcircuitry of microelectronic devices prior to assembly of the microelectronic devices with a distribution circuit of an electronic device. This process helps to insure that only functional microelectronic devices are assembled into the electronic device, thereby increasing the reliability of the electronic device. One problem associated with many, if not all, conventional microelectronic devices is the difficulty associated with attempting to rework the device should testing or burn-in show that the microcircuitry fails to meet performance requirements.

Another problem associated with some microelectronic devices, such as land grid array sockets, is that vibration can create wear at contact interfaces internal to the microelectronic device. This wear may generate contaminants, such as metal particles, that can migrate through the microelectronic device and degrade the performance of the microelectronic device. Additionally, such wear can increase the resistance of the contact interface, which also inhibits the performance of the microelectronic device.

Yet another problem associated with some microelectronic devices is that the microcircuitry in the device may not be provided with sufficient protection against environmental contaminants and/or shock loads when the device is used in certain applications, such as in cellular telephones.

Overheating due to an inadequate ability to reject heat is yet another problem associated with some microelectronic devices.

SUMMARY OF THE INVENTION

In accordance with the present invention, a microelectronic package capable of being connected to a distribution circuit is provided. The microelectronic package includes a microelectronic device having first and second oppositely facing surfaces and a plurality of Input/Output pads on the first surface capable of being electrically interconnected to a distribution circuit, a base adapted to support the microelectronic device in a predetermined operative relationship to a distribution circuit, and a first layer of elastomer gel positioned between the first surface and the base. The first surface of the microelectronic device overlays the base so as to allow an electrical interconnection through the base between the microelectronic device and a distribution circuit.

In one form the microelectronic package includes a microelectronic device having first and second oppositely facing surfaces and a plurality of Input/Output pads on the first surface capable of being electrically interconnected to a distribution circuit, a base adapted to support the microelectronic device in a predetermined operative relationship to a distribution circuit, a first layer of elastomer gel positioned between the base and the first side of the microelectronic device, and a second layer of elastomer gel applied over at least a portion of the second surface of the microelectronic device.

In one form, the microelectronic package further includes at least one electrical contact penetrating the first layer between the microelectronic device and the base, enveloped by the elastomer gel and forming an electrical interconnection with at least one of the Input/Output pads.

In one form, the base has a first plurality of holes extending through the base and the Input/Output pads are aligned with the first plurality of holes to allow an electrical interconnection through the first plurality of holes between the Input/Output pads and a distribution circuit.

In one form, the first layer of elastomer gel has a second plurality of holes aligned with the plurality of Input/Output pads and the first plurality of holes in the base to allow an electrical interconnection through the second plurality of holes between the Input/Output pads and a distribution circuit.

In one form, the package further includes a lid connectable to the base overlaying the microelectronic device to retain the microelectronic device and the first layer of elastomer gel on the base.

In one form, the lid includes an opening and the second layer is exposed at the opening to allow contact of the second layer with a surface of an electronic assembly.

In one form, the first layer is in direct contact with the first surface of the microelectronic device, and the second layer is in direct contact with the second surface of the microelectronic device.

In one form of the invention, a method of packaging a microelectronic device to be connectable to a distribution circuit is provided. The method includes the steps of providing a microelectronic device including a first surface and a plurality of Input/Output pads on the first surface capable of being electrically interconnected to a distribution circuit, providing a base adapted to support the microelectronic device in a predetermined operative relationship to the distribution circuit, and positioning a first layer of elastomer gel between the first surface and the base, with the first surface overlaying the base so as to allow an electrical interconnection through the base between the microelectronic device and a distribution circuit.

In one form of the invention, a method of packaging a microelectronic device to be connectable to a distribution circuit is provided and includes the steps of providing a microelectronic device having first and second oppositely facing surfaces and a plurality of Input/Output pads on the first surface capable of being electrically interconnected to a distribution circuit, providing a base adapted to support the microelectronic device in a predetermined operative relationship to a distribution circuit, positioning a first layer of elastomer gel between the base and the first side of the microelectronic device, and applying a second layer of elastomer gel over at least a portion of the second surface of the microelectronic device.

In one form, the step of providing a base further includes the step of forming a first plurality of holes extending through the base and alignable with the Input/Output pads to allow an electrical interconnection through the first plurality of holes between the Input/Output pads and the distribution circuit.

In one form, the method further includes the step of forming a second plurality of holes in the layer of elastomer gel aligned with both the first plurality of holes and the plurality of Input/Output pads to allow an electrical interconnection through the second plurality of holes between the Input/Output pads and a distribution circuit.

In one form, the method further includes the step of penetrating the first layer of elastomer gel with at least one electrical contact extending from the base so that the at least one electrical contact is enveloped by the elastomer gel and forms an electrical interconnection with at least one of the Input/Output pads.

In one form, the method further includes the step of placing the microelectronic device, the base, and the first and second layers of elastomer gel in an electronic assembly with the second layer of gel contacting a surface of the electronic assembly.

In one form, the step of positioning the first layer includes the step of placing the first layer in direct contact with the first surface of the microelectronic device.

In one form, the step of applying the second layer includes the step of placing the second layer in direct contact with the second surface of the microelectronic device.

In one form, the elastomer gel is a silicone elastomer gel.

In one form, the elastomer gel is a fluoro silicone elastomer gel.

DETAILED DESCRIPTION OF THE PREFERRED EMBODIMENT

Figure 1:
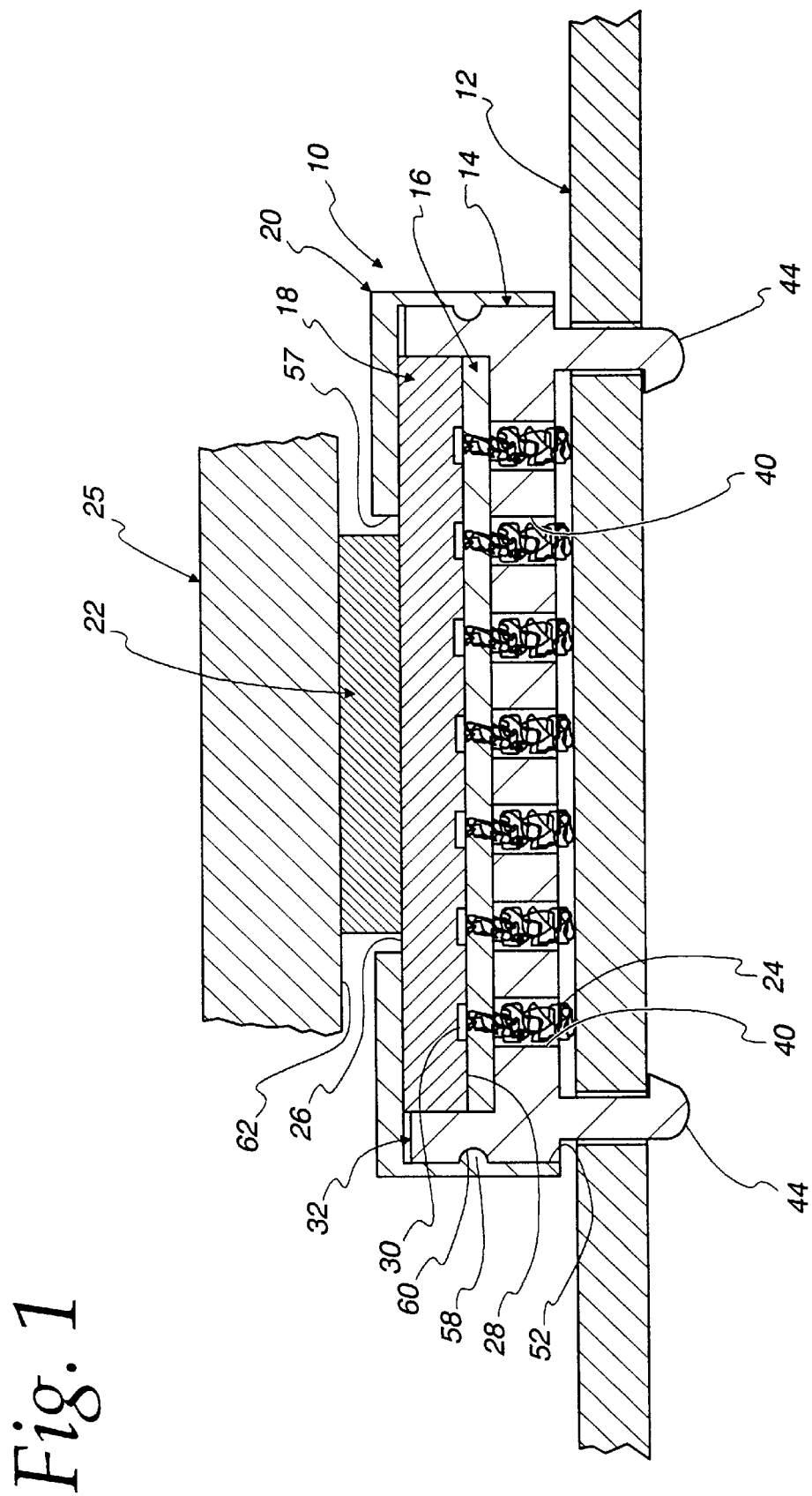
FIG. 1 is a diagrammatic sectional view of a microelectronic package embodying the present invention, connected to a distribution circuit and installed in an electronic device.
Figure 2:
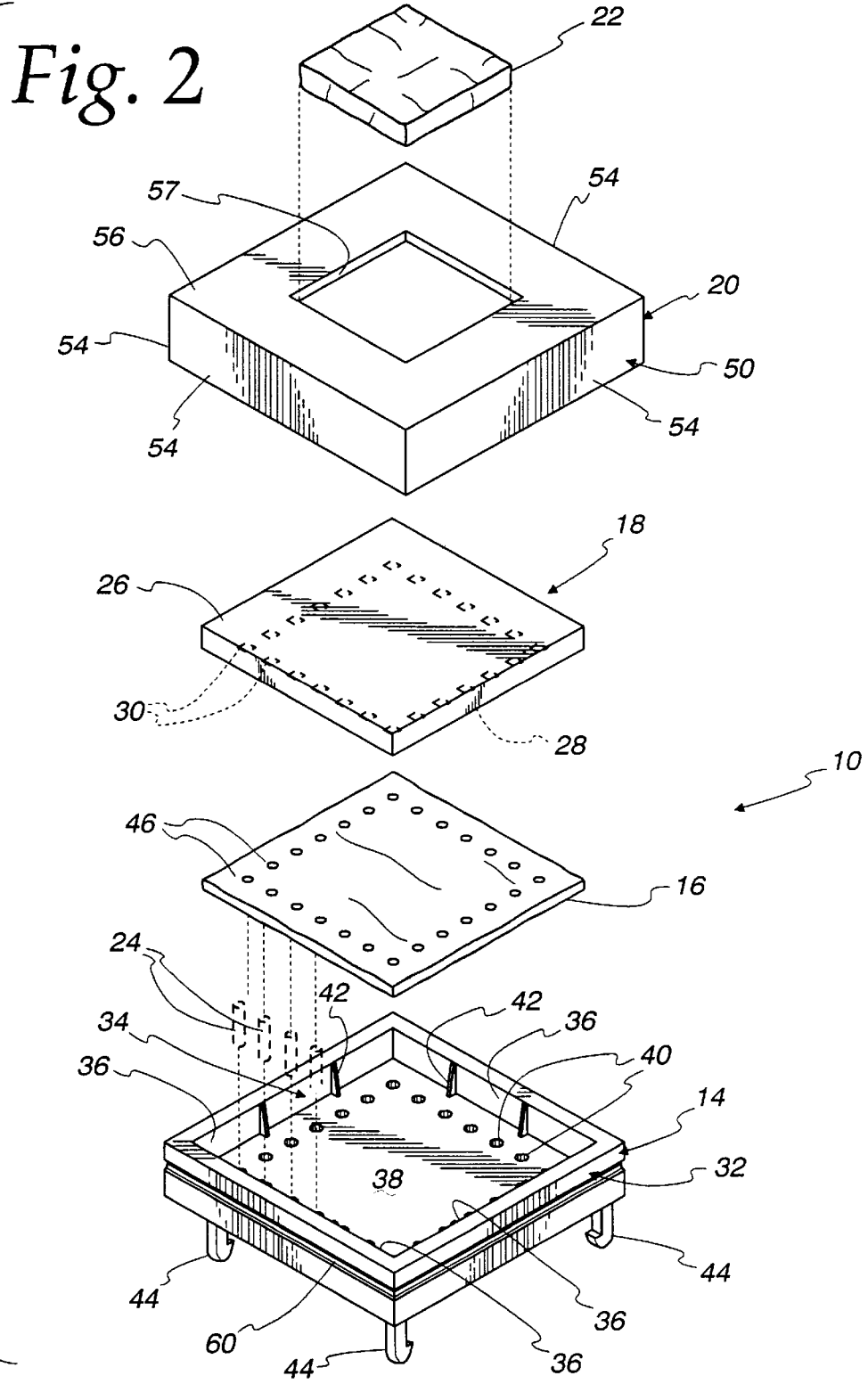
FIG. 2 is a reduced, exploded, perspective view of the microelectronic package shown in FIG. 1.

With reference to FIGS. 1 and 2, the invention is embodied in a microelectronic package 10 that is capable of being connected to a distribution circuit 12, such as a printed circuit board, a flex circuit, or an interposer circuit. As best seen in FIG. 2, the package 10 includes a base 14, a first layer of elastomer gel 16, a microelectronic device 18, a lid 20, second layer of elastomer gel 22, and a plurality of electrical contacts 24. FIG. 1 shows the package 10 and the distribution circuit 12 installed in an electronic device, such as a cellular telephone, with the second layer of elastomer gel 22 contacting a heat sink or housing wall 25 of the electronic device.

The microelectronic device 18 includes first and second oppositely facing surfaces 26 and 28, and a plurality of Input/Output pads 30 on the surface 28 that are capable of being electrically interconnected to the distribution circuit 12 by the contacts 24. It should be understood that as used herein, the term microelectronic device includes, without limitation, such devices as bare dies, dies with distribution layers, Multi-Chip Modules, Land Grid Arrays, and Chip Scale Packages.

The base 14 is shown in the form of a socket 32 having a recess 34 adapted to receive the first layer of elastomer gel 16 and the microelectronic device 18, with the layer of elastomer gel 16 sandwiched between the microelectronic device 18 and the base 14. As best seen in FIG. 2, the recess 34 is defined by side walls 36 and a base wall 38. The base wall 38 includes a plurality of holes 40 that are aligned with the Input/Output pads 30 with the microelectronic device 18 received in the recess 34, as shown in FIG. 1. The holes 40 extend through the base 14 to allow an electrical interconnection through the base 14 between the Input/Output pads 30 and the distribution circuit 12. As seen in FIG. 2, the recess 34 includes a plurality of alignment pins or ribs 42 having a close tolerance fit with the microelectronic device 18 to insure that the input/out pads 30 are aligned with the holes 40 with the microelectronic device 18 received in the recess 34. A plurality of snap fasteners 44 extend from the base 14 to align the package 10 in a predetermined operative relationship to the distribution circuit 12 and to retain the package 10 in the predetermined relationship. It should be understood that, depending upon the requirements of the particular application, the snap fasteners may be replaced by any suitable fastener commonly employed in electronic assemblies. While the base 14 may be of a multi-piece construction and formed from any suitable materials, it is preferred that the base 14 have a unitary construction molded from a suitable polymer having low dielectric properties, such as PEI (polyetherimide) or PEEK (polyether ether ketone).

It is preferred that the first layer of elastomer gel 16 be formed from a continuous film, sheet or pad of silicone elastomer gel or fluoro silicone elastomer gel having properties sufficient to provide environmental sealing and electrical insulation for the microelectronic device 18, while also having sufficient structural stability to prevent an unacceptable amount of flow of the elastomer gel from between the microelectronic device 18 and the base 14 over an anticipated temperature range for the particular application. It is also preferred that the layer of elastomer gel 16 be formed from microelectronic grade purity elastomer gel containing less than 20 parts per million of mobile metal ions, and even more preferably, less than 10 parts per million. Suitable silicone elastomer gel material may be purchased from Raychem Corporation, Electronics Division, 300 Constitution Drive, Menlo Park, Calif., 94025-1164 under several trade names, including GelTek™, HeatPath™ and ThermoFit™. Suitable fluoro silicone elastomer gel material may be purchased from the Dow Chemical Company, 2030 Dow Center, Midland, Mich., 48674.

While, as shown in FIG. 1, it is preferred that the first layer of elastomer gel 16 be continuous so that the electrical contacts must penetrate the first layer 16 and be enveloped by the elastomer gel material, pre-formed holes or openings may be provided through the first layer 16 if the particular type of electrical contact 24 selected for a particular application cannot provide an acceptable electrical interconnection with the Input/Output pads 30 after penetrating the first layer 16. Accordingly, FIG. 2 shows the first layer of elastomer gel 16 as including a plurality of holes or openings 46 that are aligned with the input/out pads 30 and the holes 40 with the microelectronic device 18 and the first layer of elastomer gel 16 received in the recess 34.

The lid 20 is shown in the form of a cap 50 having a recess 52 adapted to receive the base 14. The recess 52 is defined by four side walls 54 and a base wall 56. The base wall 56 has a central opening 57 that is adapted to receive the second layer of elastomer gel 22. The side walls 54 define a close tolerance fit with the side walls 36 of the base 14 and include a continuous rib 58 that snap fits into a continuous groove 60 formed in the side walls 36. It should be understood that the snap fit rib and groove 58, 60 are shown simply to illustrate a releasable connection, and that any suitable form of releasable connection between the lid 20 and the base 14 may be utilized. Further, while it is preferred that the lid 20 be releasably connected to the base 14, it may be acceptable in some applications to form a permanent connection between the lid 20 and the base 14, using any known form of permanent connection that is appropriate for the application. While the lid 20 may be of a multi-piece construction and formed from any suitable materials, it is preferred that the lid 20 be a unitary construction molded from a suitable polymer having low dielectric properties, such as PEI or PEEK.

It is preferred that the second layer of elastomer gel 22 be formed from a film, sheet, or pad of silicon elastomer gel or fluoro silicone elastomer gel having enhanced thermal conductivity, while also having sufficient structural stability to prevent undesirable flow of the gel over an anticipated temperature range for the particular application. Experience has shown that the thermal conductivity of such elastomer gels is comparatively insensitive to compression force, thereby providing acceptable thermal conductivity at their interfaces with other surfaces without requiring large compression forces. This is due, in part, to the inherent surface wetting capabilities of such elastomer gels. It is highly preferred that the thermal conductivity of the second layer of elastomer gel 22 be enhanced by using alumina, boron nitride, or aluminum nitride additives. It is also highly preferred that these additives be 60% to 80% by volume of the elastomer gel to optimize the thermal conductivity of the second layer of elastomer gel.

The electrical contacts 22 are shown in the form of small cylinders formed of compressed metal wire, which are preferred for applications requiring a low overall height for the package 10. However, it should be understood that any suitable electrical contact may be used, including, without limitation, formed wires or stamped contacts, both of which may be more suitable for applications having a finer pitch of the Input/Output pads. Additionally, the electrical contacts 24 may be made of any suitable electrically conductive material, including materials, such as nickel titanium, commonly referred to as "memory metals" which may provide a more constant contact force over an anticipated temperature range.

As seen in FIG. 1, with the package 10 assembled, the lid 20 overlays the microelectronic device 18 to retain the microelectronic device 18 and the first layer 16 to the base 14 with the first layer 16 completely wetting the surfaces 28 and 38. The second layer 22 is applied over a portion of the second surface 26 of the microelectronic device 18 and is exposed by the opening 62 in the lid 20. The electrical contacts 24 are inserted through the holes 40 in the base 14 and penetrate the first layer 16 to contact the Input/Output pads 30 and to be enveloped by the elastomer gel material. The electrical contacts 24 may be retained either by the intimate contact with the first layer 16 or by frictional contact with the peripheries of the holes 40. With the package 10 assembled to the distribution circuit 12, the base 14 supports the microelectronic device 18 in a predetermined operative relationship relative to the distribution circuit 12 and the fasteners 44 maintain a sufficient contact force between the Input/Output pads 30, the electrical connectors 24, and the distribution circuit 12 to produce an acceptable electrical interconnection.

While it is preferred that the first and second layers 16, 22 directly contact the microelectronic device, some applications may utilize intermediate layers of material or an air gap between the first or second layer 16, 22 and the microelectronic device or an intermediate layer. Thus, for example, the first layer 16 may be sandwiched between the microelectronic device 18 and the base 14 with an additional layer or layers of material interposed between the first layer 16 and the microelectronic device 18 or the base 14. Similarly, for example, the second layer 22 may be applied over the second surface 26 of the microelectronic device 18 with an additional layer or layers of material interposed between the second layer 22 and the second surface 26.

As shown in FIG. 1, with the package 10 assembled into an electronic device, it is preferred that the second layer 22 be placed in contact with a surface 62 of the heat sink or housing wall 25 of the electronic device to allow for enhanced thermal conduction from the microelectronic device 18 through the second layer of elastomer gel 22. Additionally, the arrangement allows for enhanced support and shock protection of the microelectronic device 18 by the second layer 22. While FIG. 1 shows a preferred construction with respect to the second layer 22, it should be understood that if a heat sink or housing wall 25 cannot be provided, the second layer 22 may be eliminated from the package 10. This would still allow a direct heat transfer path to the second surface 26 of the microelectronic device 18 through the opening 57. Similarly, it should be understood that if heat transfer from the microelectronic device is not a concern, the opening 57 and the second layer 22 may be eliminated from the package 10, unless the second layer 22 is required for shock protection of the microelectronic device 18.

The structure of the package 10 may be utilized in a number of ways with a number of different types of microelectronic devices. For example, when the microelectronic device 18 is a Chip Scale Package or Multi-chip Module, the structure of the package 10 may be used as the interposer for connecting the device 18 to the distribution circuit, thereby replacing wire bonded or flip chip interconnections to the interposer and the solder ball interconnections between the interposer and the distribution circuit. By way of further example, bare dies may be placed directly into the recess 34 of the base 14 if the spacing of the Input/Output pads is of a pitch that is compatible with the intended distribution circuit. If the pitch is too fine, a single distribution layer, such as polyimide dielectric with copper metalization, may be formed on the die surface to create a contract array of Input/Output pads 30 having a pitch that is compatible with the intended distribution circuit 12.

It should be appreciated that, due to the inherent properties of elastomer gels and, in particular, silicone and fluoro silicone elastomer gels, the first layer 16 will inhibit the migration of contaminants, such as mobile metal ions, to the microelectronic device 18, while being permeable to water vapor so as not to gather moisture at any interfaces in the package 10. Similarly, the first layer prevents contaminants generated by wear at one of the Input/Output pads 30, from migrating to other Input/Output pads 30 and the remainder of the microelectronic device.

It should also be appreciated that, due to the inherent properties of elastomer gels, the first layer will provide shock and vibration protection for the microelectronic device 18 because of the damping properties and relatively low modulus inherent in elastomer gels. Similarly, it should be appreciated that by enveloping the electrical contacts 24, the first layer 16 will tend to dampen any movement of the electrical contacts 24 relative to the Input/Output pads 30, thereby reducing or eliminating undesirable wear at the contact interface. Further, as previously noted, the second layer can be used to provide additional shock and vibration protection for the microelectronic device 18.

It should also be appreciated that the use of an elastomer gel in the first layer 16, in combination with the releasable connection between the base 14 and the lid 20, allows for relatively easy rework of the package 10 if testing or burn-in shows that the microcircuitry in the microelectronic device fails to meet performance requirements. On the other hand, if testing or burn-in fails to show a problem, the package 10 can then be directly assembled to a distribution circuit, without requiring additional packaging after testing or burn-in. This potentially reduces the manufacturing costs while enhancing the overall assembly capabilities of an electronic device utilizing the package 10.

We claim:

1. A microelectronic package capable of being connected to a distribution circuit, the microelectronic package comprising:
   a microelectronic device comprising first and second oppositely facing surfaces and a plurality of Input/Output pads on the first surface capable of being electrically interconnected to a distribution circuit;
   a base adapted to support the microelectronic device in a predetermined operative relationship to a distribution circuit,
   the first surface of the microelectronic device overlaying the base so as to allow an electrical interconnection through the base between the microelectronic device and a distribution circuit; and
   a layer of elastomer gel between the first surface and the base and in direct contact with said first surface.

2. The microelectronic package of claim 1 wherein the elastomer gel is a silicone elastomer gel.

3. The microelectronic package of claim 1 wherein the elastomer gel is a fluoro silicone elastomer gel.

4. The microelectronic package of claim 1 wherein the base has a first plurality of holes extending through the base and the Input/Output pads are aligned with the first plurality of holes to allow an electrical interconnection through the first plurality of holes between the Input/Output pads and a distribution circuit.

5. The microelectronic package of claim 4 wherein the layer of elastomer gel has a second plurality of holes aligned with both the first plurality of holes and the plurality of Input/Output pads to allow an electrical interconnection through the second plurality of holes between the Input/Output pads and a distribution circuit.

6. The microelectronic package of claim 1 further comprising a lid connected to the base overlaying the microelectronic device to retain the microelectronic device and the layer of elastomer gel on the base.

7. The microelectronic package of claim 1 further comprising at least one electrical contact penetrating the first layer between the microelectronic device and the base, enveloped by the elastomer gel and forming an electrical interconnection with at least one of the Input/Output pads.

8. The microelectronic package of 1 wherein the base comprises a recess adapted to receive the layer of elastomer gel and the microelectronic device, the recess including a plurality of ribs having a close tolerance fit with the microelectronic device to ensure that the microelectronic is aligned in a predetermined relationship with the base.

9. A microelectronic package capable of being connected to a distribution circuit, the microelectronic package comprising:
   a microelectronic device having first and a second oppositely facing surfaces and a plurality of Input/Output pads on the first surface capable of being electrically interconnected to a distribution circuit;
   a base adapted to support the microelectronic device in a predetermined operative relationship to a distribution circuit;
   a first layer of elastomer gel between the base and the first surface of the microelectronic device; and
   a second layer of elastomer gel applied over at least a portion of the second surface of the microelectronic device.

10. The microelectronic package of claim 9 wherein the elastomer gel of at least one of the first and second layers is a silicone elastomer gel.

11. The microelectronic package of claim 9 wherein the elastomer gel of at least one of the first and second layers is a fluoro silicone elastomer gel.

12. The microelectronic package of claim 9 further comprising a lid connected to the base overlaying the microelectronic device to retain the microelectronic device and the first layer of elastomer gel on the base, the lid including an opening, and wherein the second layer is exposed at the opening to allow contact of the second layer with a surface of an electronic assembly.

13. The microelectronic package of claim 9 wherein the first layer is in direct contact with the first surface of the microelectronic device, and the second layer is in direct contact with the second surface of the microelectronic device.

14. A method of packaging a microelectronic device connectable to a distribution circuit, the method comprising the steps of:
   providing a microelectronic device comprising a first surface and a plurality of Input/Output pads on the first surface capable of being electrically interconnected to a distribution circuit;
   providing a base adapted to support the microelectronic device in a predetermined operative relationship to a distribution circuit; and
   positioning a layer of elastomer gel in direct contact with the first surface and between the first surface and the base, the first surface overlaying the base so as to allow an electrical interconnection through the base between the microelectronic device and a distribution circuit.

15. The method of claim 14 wherein the step of providing a base further comprises the step of forming a first plurality of holes extending through the base and alignable with the Input/Output pads to allow an electrical interconnection through the first plurality of holes between the Input/Output pads and a distribution circuit.

16. The method of claim 15 further comprising the step of forming a second plurality of holes in the layer of elastomer gel aligned with both the first plurality of holes and the plurality of Input/Output pads to allow an electrical interconnection through the second plurality of holes between the Input/Output pads and a distribution circuit.

17. The method of claim 14 further comprising the step of penetrating the layer of elastomer gel with at least one electrical contact extending from the base so that the at least one electrical contact is enveloped by the elastomer gel and forms an electrical interconnection with at least one of the Input/Output pads.

18. The method of claim 14 wherein the step of positioning a layer of elastomer gel comprises the step of positioning a layer of silicone elastomer gel between the microelectronic device and a distribution circuit.

19. The method of claim 14 wherein the step of positioning a layer of elastomer gel comprises the step of positioning a layer of fluoro silicone elastomer gel between the microelectronic device and the distribution circuit.

20. The method of claim 14 further comprising the step of connecting a lid to the base overlaying the microelectronic device to retain the microelectronic device and the layer of elastomer gel on the base.

21. A method of packaging a microelectronic device connectable to a distribution circuit, the method comprising the steps of:
   providing a microelectronic device having first and a second oppositely facing surfaces and a plurality of Input/Output pads on the first surface capable of being electrically interconnected to a distribution circuit;
   providing a base adapted to support the microelectronic device in a predetermined operative relationship to a distribution circuit;

positioning a first layer of elastomer gel between the base and the first surface of the microelectronic device; and applying a second layer of elastomer gel over at least a portion of the second surface of the microelectronic device.

22. The method of claim 21 wherein the step of applying a second layer of elastomer gel comprises the step of applying a layer of silicone elastomer gel over at least a portion of the second surface of the microelectronic device.

23. The method of claim 21 wherein the step of applying a second layer of elastomer gel comprises the step of applying a layer of fluoro silicone elastomer gel over at least a portion of the second surface of the microelectronic device.

24. The method of claim 21 further comprising the step of placing the microelectronic device, the base, and the first and second layers of elastomer gel in an electronic assembly with the second layer of gel contacting a surface of the electronic assembly.

25. The method of claim 21 wherein the step of positioning a first layer of elastomer gel comprises the step of placing the elastomer gel in direct contact with the first surface of the microelectronic device, and the step of applying a second layer of elastomer gel comprises the step of placing the second layer in direct contact with the second surface of the microelectronic device.

* * * * *